United States Patent
Potanin et al.

(10) Patent No.: US 7,394,309 B1
(45) Date of Patent: Jul. 1, 2008

(54) BALANCED OFFSET COMPENSATION CIRCUIT

(75) Inventors: Vladislav Potanin, San Jose, CA (US); Elena Potanina, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 58 days.

(21) Appl. No.: 11/505,109

(22) Filed: Aug. 15, 2006

(51) Int. Cl.
*H03K 5/00* (2006.01)
*H03F 1/02* (2006.01)

(52) U.S. Cl. .................. 327/554; 327/94; 327/337; 330/9; 341/155

(58) Field of Classification Search ............ 327/554, 327/362, 94, 337; 330/9; 341/155
See application file for complete search history.

(56) References Cited

U.S. PATENT DOCUMENTS

| | | | | |
|---|---|---|---|---|
| 4,565,971 A | * | 1/1986 | Brookshire | 330/9 |
| 4,697,152 A | * | 9/1987 | Westwick | 330/9 |
| 5,410,272 A | * | 4/1995 | Haberland et al. | 330/129 |
| 5,479,130 A | * | 12/1995 | McCartney | 327/341 |
| 6,166,581 A | * | 12/2000 | Liu et al. | 327/337 |
| 6,377,638 B1 | * | 4/2002 | Tamura et al. | 375/348 |

OTHER PUBLICATIONS

Petrie, C.; Tianxue Sun; Miller, M., "A high-gain offset-compensated differential amplifier", Circuits and Systems, 2004. ISCAS apos:04. Proceedings of the 2004 International Symposium on vol. 1, Issue, May 23-26, 2004 pp. I-489-492 vol. 1; Digital Object Identifier 10.1109/ISCAS.2004.1328238.

* cited by examiner

*Primary Examiner*—Dinh T. Le
(74) *Attorney, Agent, or Firm*—Merchant & Gould

(57) ABSTRACT

Balanced offset compensation is provided for a differential amplifier circuit. Two sets of three switches are employed between respective inputs and outputs of the differential amplifier to shunt the outputs to the input terminals during auto-zeroing phase. By opening and closing different combinations of the switches during auto-zeroing and operation phases, differential degradation due to unbalanced leakage currents is substantially reduced.

16 Claims, 7 Drawing Sheets

*DIFFERENTIAL AMPLIFIER WITH AUTO-ZEROING OFFSET CANCELLATION CIRCUIT*

*FIG. 1*

DIFFERENTIAL AMPLIFIER WITH
OFFSET CANCELLATION CIRCUIT

AUTO-ZEROING OFFSET CANCELLATION
CIRCUIT CORE

BALANCED OFFSET COMPENSATION CIRCUIT

FIELD OF INVENTION

The present invention relates to signal processing, and, in particular, to a balanced offset compensation circuit configured to provide enhanced offset compensation for differential amplifiers.

BACKGROUND

The input offset voltage of a differential amplifier is an important consideration when constructing a precision circuit. Ideally, the differential amplifier should provide a zero output voltage when the applied differential input voltage signal is zero. However, due to a number of reasons including inherent transistor mismatches in differential amplifiers, a zero differential input signal can produce a non-zero output signal without some form of input offset voltage cancellation to compensate for the internal offset error of the amplifier. The offset error is typically presented over the entire operating range of the amplifier. Traditional offset compensation techniques may involve chopping the input signal and filtering the output voltage in continuous time applications. Yet, these approaches typically work with a high frequency signal greater than the bandwidth of the amplifier to chop the input signal.

Another approach utilizes storing an input offset voltage across a capacitor coupled in series with the inverting input terminal of the differential amplifier to compensate the input signal for errors induced by the amplifier mismatches. During an auto-zeroing phase, switching circuits are closed to configure the differential amplifier as a unity gain buffer while a reference potential is applied through the series capacitor to the inverting input terminal, which appears at the output of the amplifier modified by the internal offset. The input offset voltage is thereby stored across the series capacitor. During the operational phase, the reference potential is replaced with the input signal where the input offset voltage stored across the capacitor is subtracted from the input signal and added back as the input signal propagates through the operational amplifier thereby cancelling the internal offset error. However, any error or leakage appearing on the series capacitor affects the input offset compensation. Unbalanced leakage may cause accumulation of differential voltage on the amplifier input terminals over time resulting in a circuit malfunction when offset compensation period becomes very long.

The auto-zeroing phase limits the continuous time operation of the amplifier in that the input signal must be disabled during the time the input offset voltage is stored across the series capacitor. Therefore, the method of storing the input offset voltage across the series capacitor is preferable for systems using sampling since it allows time for the auto-zeroing phase.

Thus, it is with respect to these considerations and others that the present invention has been made.

BRIEF DESCRIPTION OF THE DRAWINGS

Non-limiting and non-exhaustive embodiments are described with reference to the following drawings.

DETAILED DESCRIPTION

Various embodiments will be described in detail with reference to the drawings. Reference to various embodiments does not limit the scope of the invention, which is limited only by the scope of the claims attached hereto. Additionally, any examples set forth in this specification are not intended to be limiting and merely set forth some of the many possible embodiments for the claimed subject matter.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity.

Briefly stated, embodiments are related to providing balanced offset compensation to a differential amplifier circuit. Three switches are added between each input and output of the differential amplifier, respectively. By opening and closing combinations of switches during auto-zeroing and operation phases, differential degradation due to unbalanced leakage currents is substantially reduced.

While a preferred embodiment of the present invention may be implemented in an ADC circuit, the invention is not so limited. The described differential amplifier with balanced offset compensation circuit may be employed in any electronic device where differential signals are to be amplified.

Figure 1:
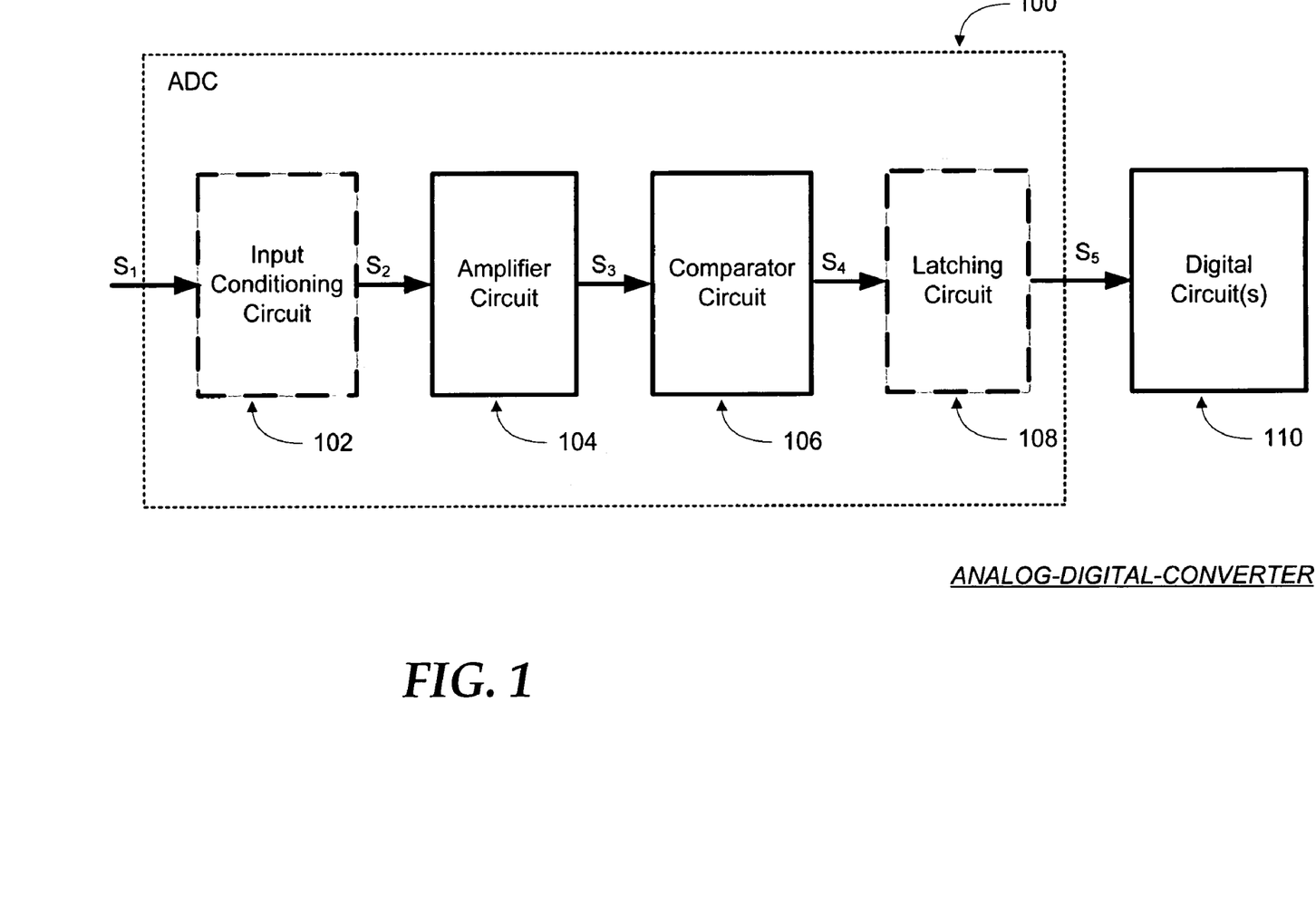
FIG. 1 illustrates a functional block diagram of an electronic device that includes an analog-digital-converter (ADC) component with an amplifier circuit where embodiments may be implemented.

FIG. 1 illustrates a functional block diagram of an electronic device that includes an analog-digital-converter (ADC) component with an amplifier circuit where embodiments may be implemented. The electronic device may be any electronic device that is arranged to receive analog signal(s), convert them to digital signal(s) and use the digital signal(s) in one or more digital circuits. In a basic and exemplary embodiment, the electronic device may include two main blocks: ADC component 100 and digital circuits 110.

ADC component 100 may include four main circuits such as optional input conditioning circuit 102, amplifier circuit 104, comparator circuit 106, and optional latching circuit 108. In an operation, an analog input signal $S_1$ may be received and preconditioned by the optional input conditioning circuit 102. Input conditioning may include filtering, preamplification, and the like. Optional input conditioning circuit 102 may also convert a single-ended signal to a differential signal $S_2$ to be amplified by differential amplifier circuit 104. The amplified differential signal $S_3$ is converted to logic levels by comparator circuit 106 generating the digital signal $S_4$. An optional latching circuit may also be included in ADC component 100 receiving $S_4$ and providing $S_5$ to digital circuits 110.

Digital circuits 110 may be any digital circuit that is arranged to process and/or consume digital signal $S_5$. All or part of digital circuits 110 may be off-chip.

The block diagram of the electronic device and ADC component 100 described above is for illustration purposes only, and does not constitute a limitation on embodiments. The circuit may be implemented using fewer or additional blocks such as power supply circuits, filtering circuits, level shifting circuits, and the like, using the principles described herein. Furthermore, part or all of the circuits described above may be integrated. The amplified differential signal may be provided to circuits within the same IC or in other parts of an electronic device.

Figure 2:
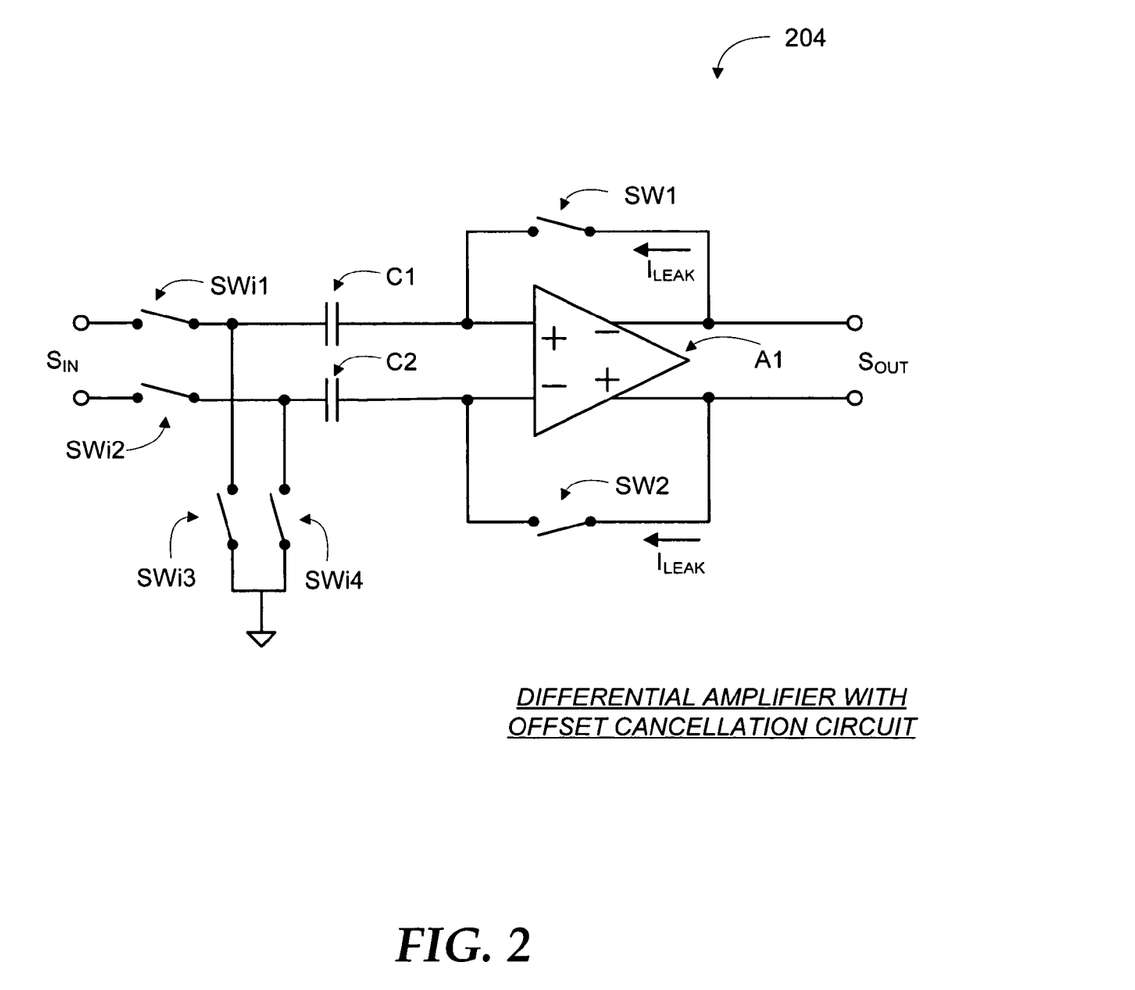
FIG. 2 schematically illustrates an example differential amplifier circuit with offset cancellation.

FIG. 2 schematically illustrates an example differential amplifier circuit with offset cancellation. The example circuit includes decoupling capacitors C1 and C2 coupled to the input terminals of differential amplifier A1. Switches SW1 and SW2 are configured to couple the input terminals of differential amplifier A1 to its output terminals, respectively. Switch pair SWi1 and SWi2 are used to connect and disconnect an input signal $S_{IN}$ to and from the decoupling capacitors C1 and C2, respectively. Finally, Switch pair SWi3 and SWi4 are arranged to connect an input signal side of capacitors C1 and C2 to a signal ground, respectively. The signal ground may be a low impedance DC voltage of a predetermined level.

In an operation, switches SW1 and SW2 are closed during an auto-zeroing phase allowing the input terminals to reach the same potential as the output terminals. Optional switch pairs SWi1, SWi2 and SWi3, SWi4 are used to decouple the input signal from the input terminals during the auto-zeroing phase and discharge the decoupling capacitors to the signal ground.

Offset voltages normally occur at the output in the case of integrated differential amplifiers. The offset voltages may, for example, be determined by manufacturing tolerances that may have a negative effect on the symmetry of the circuit configuration. Other possible causes for offset voltages at outputs of differential amplifiers may include mismatching of the integrated components. In practical applications, if the signal fed to an ADC circuit has a DC voltage offset, the converters, which have a limited dynamic range, may be overloaded.

Offset compensation by use of decoupling capacitors also presents the disadvantage that leakage currents may flow due to less than ideal conditions in the capacitor or the integrated circuit, whereby the voltage present on the capacitor is subject to temporal drift. This may further distort the offset compensation. Consequently, the selected capacitor must not be too small. Furthermore, excessive charge or discharge currents may result in control instabilities.

A key disadvantage of conventional offset compensated circuits, such as example differential amplifier circuit 204, is distortion of stored offset over time due to leakage in switches SW1 and SW2. In a FET switch implementation, the leakage of the switches mainly depends on a gate length. Due to inherent component mismatches, leakage in practical circuits may be even higher than simulated leakages and cause unbalanced offset distortion. Moreover, in a multi-stage amplification circuit, the effects of unbalanced offset distortion may accumulate.

Figure 3:
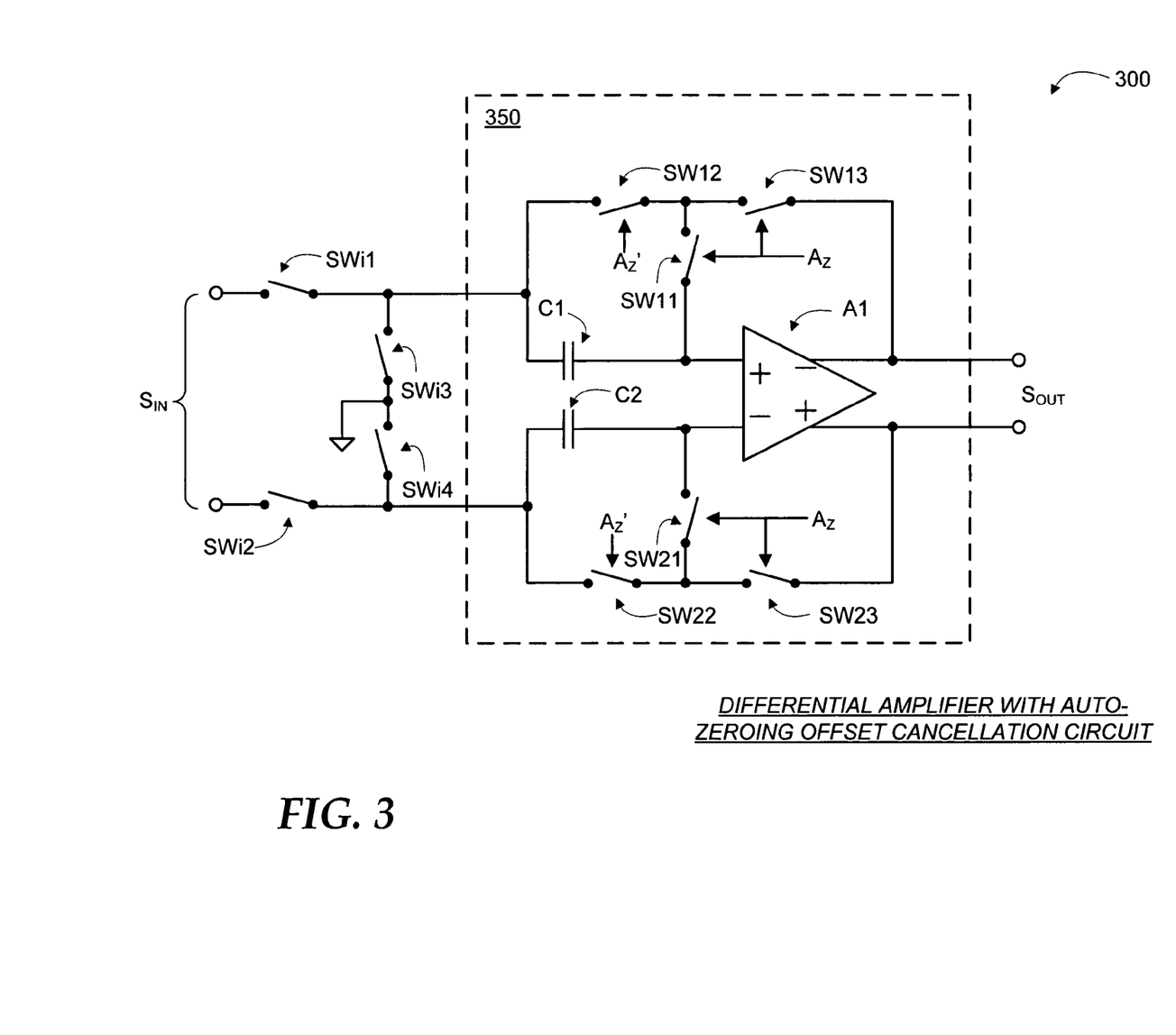
FIG. 3 schematically illustrates an embodiment of differential amplifier with auto-zeroing offset cancellation.

FIG. 3 schematically illustrates an embodiment of differential amplifier with auto-zeroing offset cancellation. The core elements of the offset balanced differential amplifier include amplifier A1, decoupling capacitors C1 and C2, and switch sets SW11, SW12, SW13 and SW21, SW22, SW23 for each leg of the amplifier. Optional switch pairs SWi1, SWi2 and SWi3, SWi4 may also be included in the offset compensated differential amplifier circuit 300.

Figure 6:
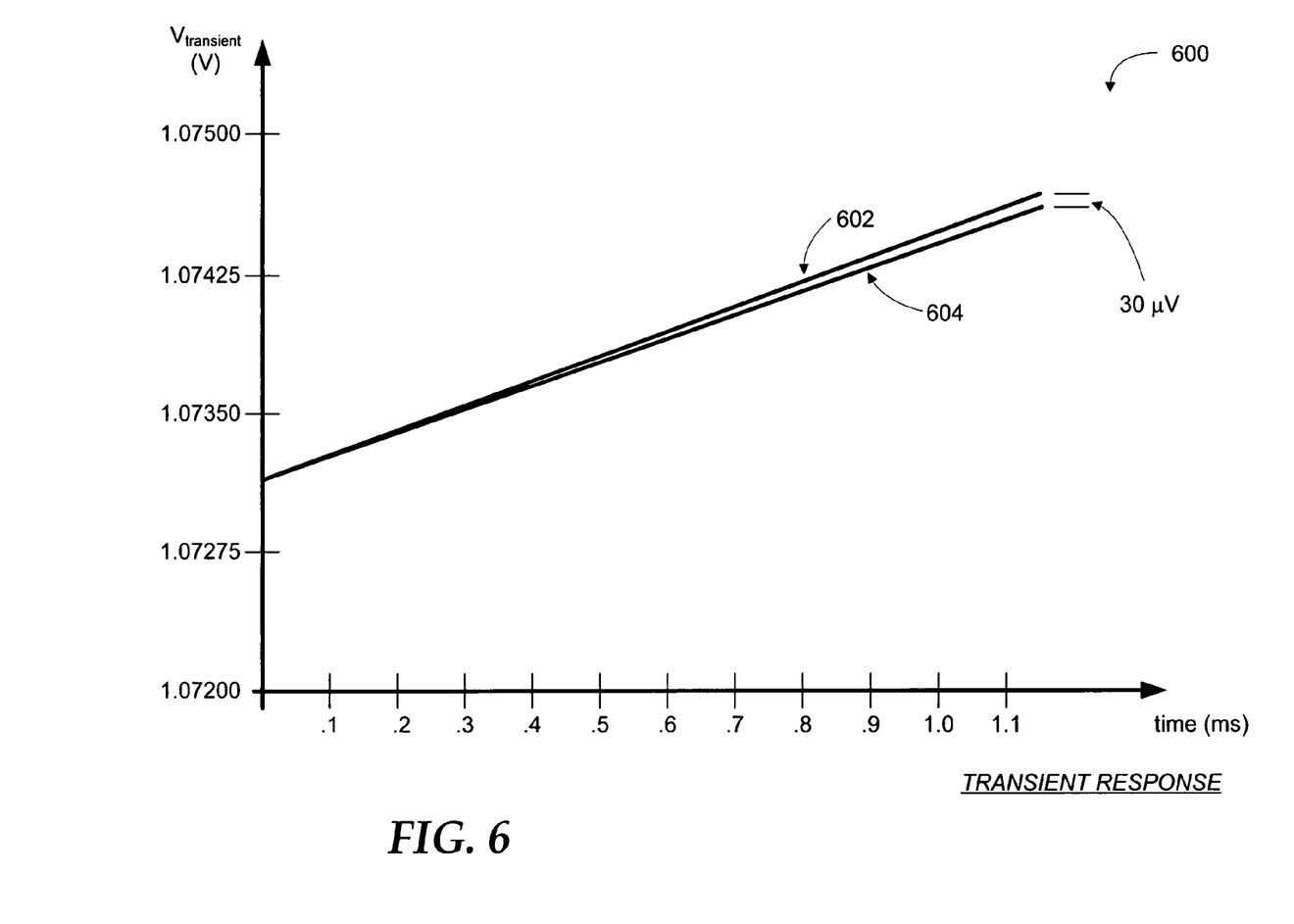
FIG. 6 graphically illustrates a transient response of the differential amplifier circuit of FIG. 3.

Switches SW11, SW13 and SW21, SW23 act as feedback switches for respective legs of the differential amplifier and "auto-zero" the input terminals based on feedback from the output terminals in an auto-zeroing mode. Switches SW12 and SW22 are opened during the auto-zeroing mode and closed during a normal operation mode, thereby providing for substantially balanced biasing of switches SW11 and SW21. As a result, offset accumulation caused by unbalanced leakage in feedback switches is substantially reduced (as shown in FIG. 6).

In an operation, switches SW11, SW13, SW21, and SW23 may be controlled by an auto-zeroing signal $A_z$ for simultaneous closing (and opening). Switches SW12 and SW22 may be operated in response to an inverted auto-zeroing signal $A_z'$, again for simultaneous operation with the other feedback switches.

Optional switch pair SWi1 and SWi2 may be employed to decouple the input signal $S_{IN}$ from the decoupling capacitors C1 and C2, respectively. Optional switch pair SWi3 and SWi4 may be utilized to discharge the decoupling capacitors to signal ground during the auto-zeroing phase.

Switches S1 and S2 represent components for resetting the conditions of the input nodes of differential amplifier A1 based on feedback from the output signal and feeding forward from the input signal. Therefore, switches S1 and S2 may be implemented in a number of ways using the principles described herein. An example implementation is described below in the embodiment of FIG. 4.

Figure 4:
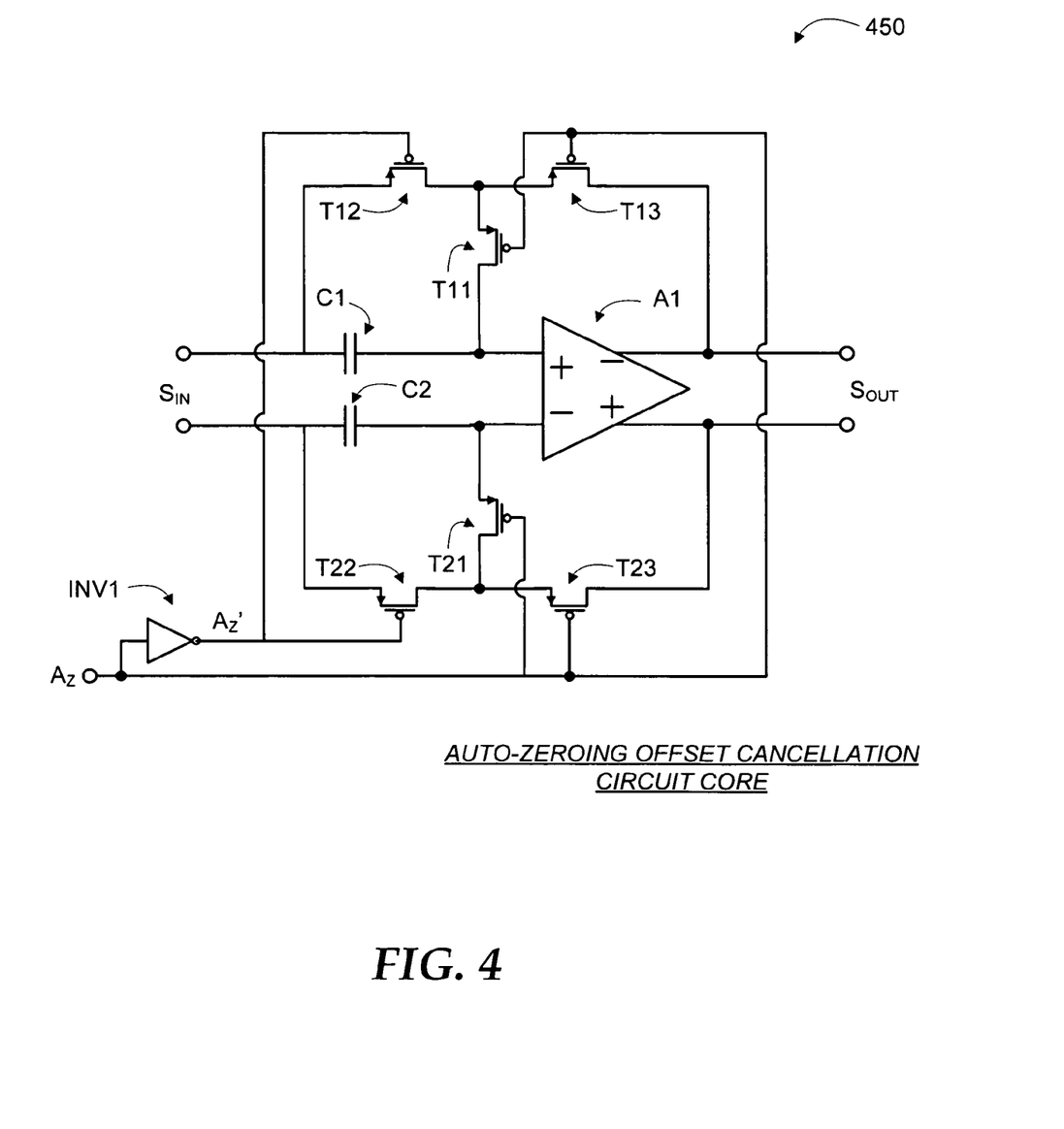
FIG. 4 schematically illustrates another embodiment of the differential amplifier with auto-zeroing offset cancellation.

FIG. 4 schematically illustrates another embodiment of the differential amplifier with auto-zeroing offset cancellation. Circuit 450 is a PMOS FET implementation of core circuit 350 of FIG. 3.

Circuit 450 includes differential amplifier A1 with DC decoupling capacitors capacitors C1 and C2 at its input terminals. Transistor pairs T11, T13 and T21, T23 turn on in response to auto-zeroing signal $A_z$ and provide feedback to the input terminals from the respective output terminals during the auto-zeroing phase. Both pairs are turned off during the operation phase. Transistors T12 and T22 turn off during the auto-zeroing phase in response to inverted auto-zeroing signal $A_z'$ during the auto-zeroing phase and are turned on during the operation phase. By turning the transistors T12 and T22 on and off in opposite phases to the feedback transistors, T11 and T21 are biased in a balanced manner substantially reducing a leakage current imbalance at the input terminals, thereby an accumulated offset. Thus, a degradation of transient response due to accumulated offset caused by leakage currents in the feedback transistors is substantially reduced.

The inverted auto-zeroing signal $A_z'$ is provided by inverter INV1 from $A_z$ in the illustrated circuit. The inverted control signal may also be generated using other methods known in the art.

While the switches of circuit 350 are embodied as PMOS FETs in circuit 450 of FIG. 4, other technologies may also be used. For example, the switches may be implemented as NMOS FET, BJT, or other types of transistors. Moreover, more complicated circuits comprising multiple components may also be employed to implement the switch sets of circuit 350. For example, each switch may be implemented as a pair of serially coupled transistors.

Embodiments of the present disclosure are not limited to the above described circuits. Other configurations with additional or fewer components may be implemented using the principles described herein. For example, one or both of the optional switch pairs of circuit 300 may be implemented in some embodiments. Additional filtering or feedback circuits may also be employed as well as multiple stages of differential amplifiers.

Figure 5:
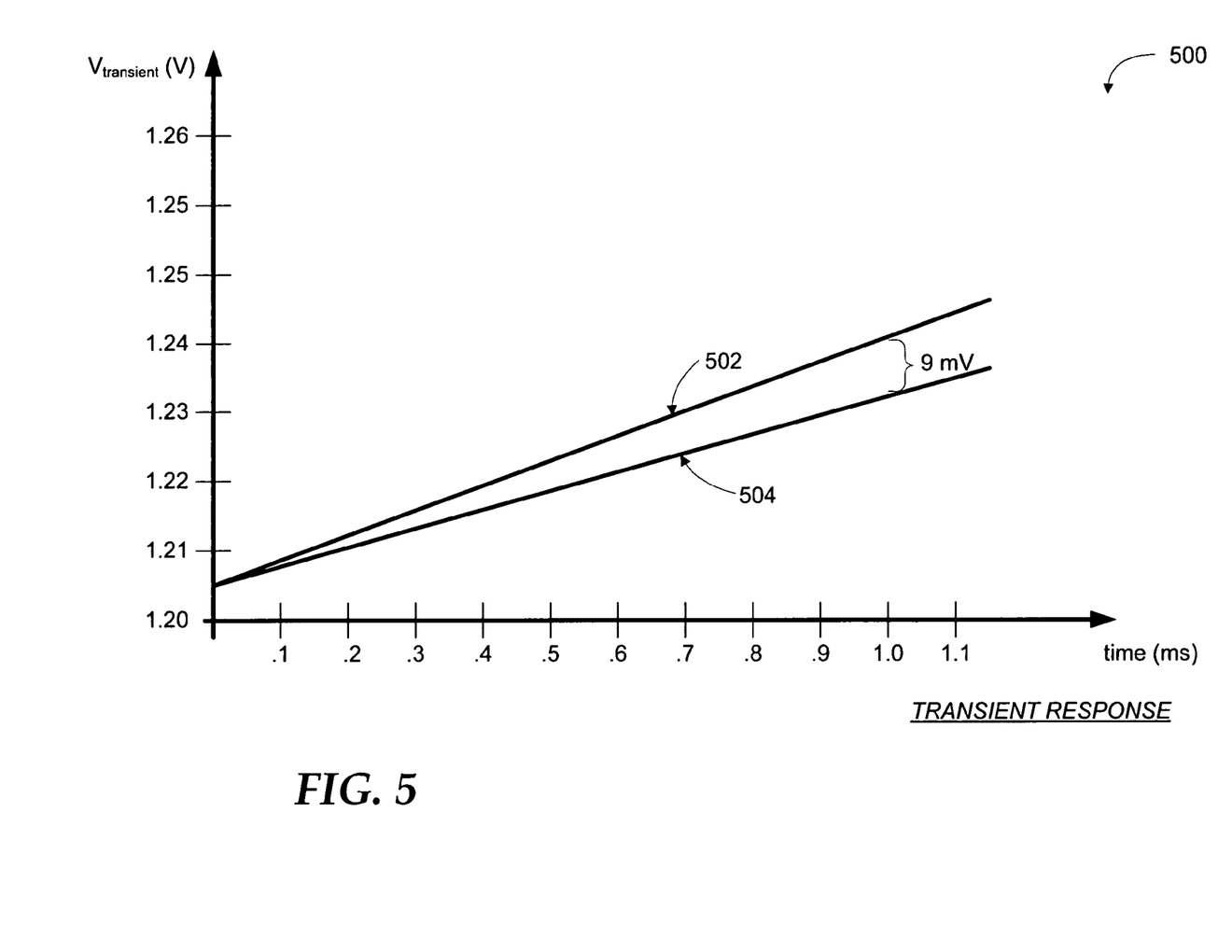
FIG. 5 graphically illustrates a transient response of the example differential amplifier circuit of FIG. 2.

FIG. 5 graphically illustrates a transient response of the example differential amplifier circuit of FIG. 2.

Diagram 500 shows transient response ($V_{transient}$) over time. Curve 504 is the response of an ideal amplifier compared to curve 502 of the differential amplifier circuit 204 of FIG. 2. For simulation purposes, SW1 and SW2 have been constructed as PMOS FETs using a 0.35 μm CMOS process. The amplifier is assumed to be biased with maximum differential input voltage at 2.0 V.

As diagram 500 shows, a differential offset voltage of 9 mV builds up over 1 ms at 125° C. This distortion can result in overloading of an ADC circuit that includes the differential amplifier, accumulating distortion in subsequent amplification stages, degradation of signal quality, and the like.

FIG. 6 graphically illustrates a transient response of the differential amplifier circuit 300 of FIG. 3. As shown by the ideal amplifier curve 604 and curve 602 for the differential amplifier circuit 300, the accumulated offset voltage due to leakage is 30 μV after 1 ms under the same operating conditions as in FIG. 5.

The substantially smaller offset voltage of differential amplifier circuit 300 is mainly due to switches SW11 and SW21 being biased with substantially the same voltage, thus being balanced. Therefore, a degradation caused by offset accumulation in circuit 300 is substantially less than a conventional circuit.

Embodiments additionally include methods of operation. A method of operation may be generally defined as a group of steps or operations leading to a desired result, due to the nature of the elements in the steps and their sequence. The methods are usually advantageously implemented as a sequence of steps or operations for a processor or programmable device, such as the structures described above.

Performing the steps, instructions, or operations of the methods requires manipulation of physical quantities. Usually, though not necessarily, these quantities may be transferred, combined, compared, and otherwise manipulated or processed according to the steps or instructions. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as signals, voltages, currents, bits, values, symbols, or the like. It should be borne in mind, however, that all of these and similar terms are associated with the appropriate physical quantities, and that these terms are merely convenient labels applied to these physical quantities, individually or in groups.

This detailed description is presented largely in terms of schematic diagrams, flowcharts, algorithms, and symbolic representations of operations. Indeed, such descriptions and representations are the type of convenient labels used by those skilled in integrated circuit design arts to effectively convey the substance of their work to others skilled in the art. A person skilled in the art of electronic circuits may use these descriptions to readily generate specific circuits, devices, and methods for implementing the embodiments.

As mentioned above, the claimed subject matter also includes methods. Some are methods of operation of a differential amplifier circuit with balanced offset compensation. These methods can be implemented in any number of ways, including the structures described in this document. One such way is by machine operations, of devices of the type described in this document. Another optional way is for one or more of the individual operations of the methods to be performed by distinct components or subcircuits of a circuit.

Methods are now described more particularly according to embodiments.

Figure 7:
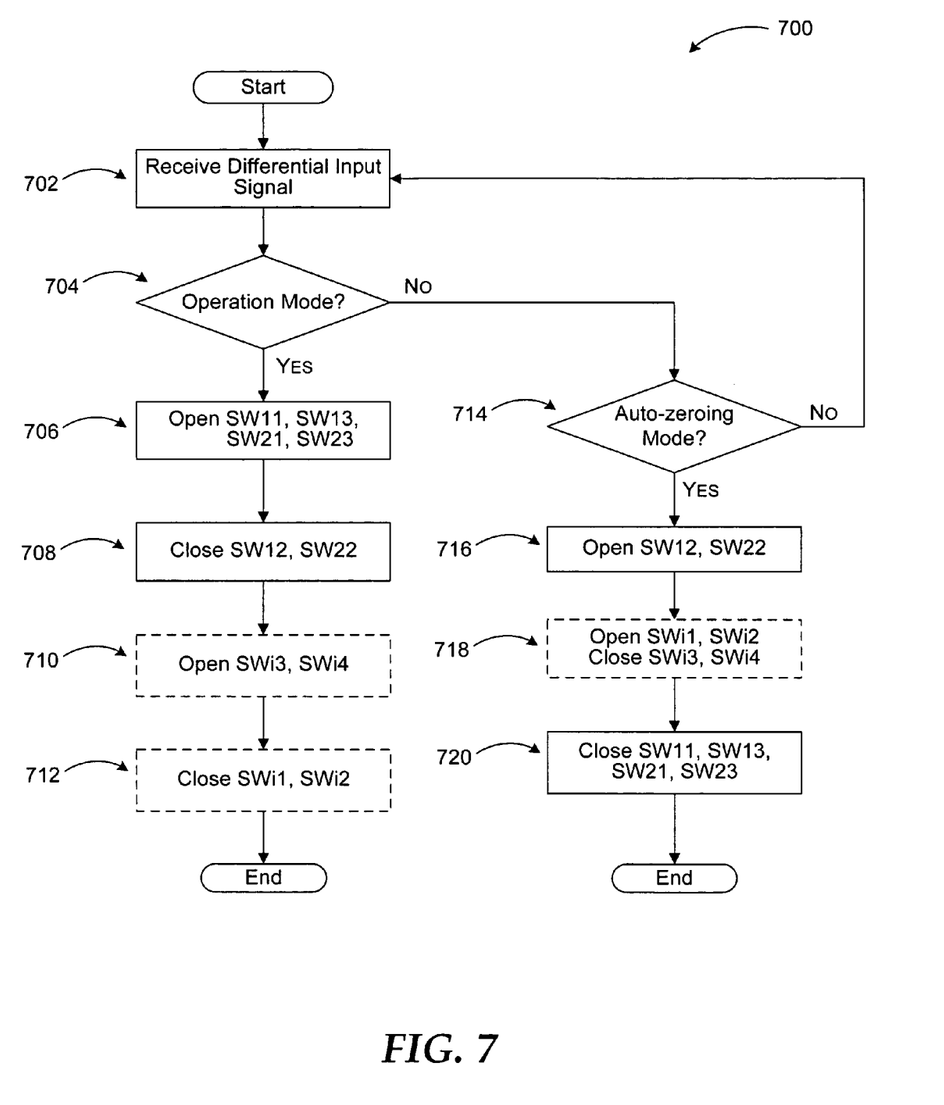
FIG. 7 is flow chart of a process for providing balanced offset compensation for a differential amplifier circuit according to an embodiment.

FIG. 7 is flow chart of a process for providing balanced offset compensation for a differential amplifier circuit according to an embodiment. The method of flowchart 700 may be implemented in a differential amplifier circuit such as the amplifier circuit 104 of FIG. 1.

According to an operation 702, a differential analog signal is received for amplification. As discussed previously, the signal may be preconditioned (e.g. filtered, preamplified, and the like) before being provided to the offset compensated differential amplifier circuit. Processing advances from operation 702 to decision operation 704.

At decision operation 704, a determination is made whether the circuit is in operation mode. If the circuit is in operation mode, processing continues to operation 706. If the circuit is not in operation mode, processing moves to decision operation 714.

At operation 706, switches SW11, SW13, SW21, and SW32 of circuit 300 are closed. The order of closing and opening the switches in operations 706 through 712 prevent charge injection and reduce leakage in a balanced manner when switching from the auto-zeroing mode to the operation mode. Processing advances from operation 706 to operation 708.

At operation 708, switches SW12 and SW22 are closed. Processing moves from operation 708 to optional operation 710.

At optional operation 710, the optional switch pair SWi3 and SWi4 are opened, if they exist. By opening the optional switch pair decoupling capacitors serially connected to the input lines are removed from a signal ground. Processing advances from optional operation 710 to optional operation 712.

At optional operation 712, the optional switch pair SWi1 and SWi2 are closed, if they exist. By closing the switch optional switch pair, differential input signal is provided through the decoupling capacitors to the input terminals of the differential amplifier. After optional operation 712, processing moves to a calling process for further actions.

At decision operation 714 following a negative determination at decision operation 704, a determination is made whether the differential amplifier circuit is in an auto-zeroing mode. If the circuit is not in an auto-zeroing mode, it may be turned off or in an error mode. In that case, processing returns to operation 702. If the circuit is in the auto-zeroing mode, however, processing continues to operation 716.

At operation 716, switches SW12 and SW22 of circuit 300 are opened. Processing moves from operation 716 to optional operation 718.

If the optional switch pairs SWi1, SWi2 and SWi3, SWi4 exist, the first pair is opened and the second pair is closed optional operation 718 following operation 716. This results in disconnecting the input signal from the decoupling capacitors. Processing advances from optional operation 718 to operation 720.

At operation 720, switches SW11, SW13, SW21, and SW23 are closed allowing the differential amplifier to "auto-zero" its input terminals based on feedback from the output terminals. By using the three switch sets on each leg of the differential amplifier, switches SW11 and SW21 are biased in a balanced manner substantially reducing the offset accumulation due to leakage in the feedback switches. Processing moves to a calling process after operation 720 for further actions.

In the above, the order of operations is not constrained to what is shown, and different orders may be possible. In addition, actions within each operation can be modified, deleted, or new ones added without departing from the scope and spirit of the claimed subject matter. Plus other, optional operations and actions can be implemented with these methods, as will be inferred from the earlier description.

In this description, numerous details have been set forth in order to provide a thorough understanding. In other instances, well-known features have not been described in detail in order to not obscure unnecessarily the description.

A person skilled in the art will be able to practice the embodiments in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A circuit for compensating input offset of a differential amplifier circuit, comprising:
    a first capacitor coupled between a first signal input node and a first amplifier input node;
    a second capacitor coupled between a second signal input node and a second amplifier input node;
    a first switch coupled between the first signal input node and a first node;
    a second switch coupled between the first node and the first amplifier input node;
    a third switch coupled between the first node and a first amplifier output node;
    a fourth switch coupled between the second signal input node and a second node;
    a fifth switch coupled between the second node and the second amplifier input node; and
    a sixth switch coupled between the second node and a second amplifier output node.

2. The circuit of claim 1, wherein the first and fourth switches are arranged to be in open state and the second, third, fifth, and sixth switches are arranged to be in closed state during an auto-zeroing phase of the differential amplifier circuit.

3. The circuit of claim 2, wherein the first and fourth switches are arranged to be in closed state and the second, third, fifth, and sixth switches are arranged to be in open state during an operation phase of the differential amplifier circuit.

4. The circuit of claim 3, further comprising:
    a first pair of serially coupled discharge switches connected between the first signal input node and the second signal input node, wherein a node coupling the discharge switches is also connected to a signal ground node, and wherein the first pair of discharge switches are arranged to be in an open state during the operation phase and in a closed state during the auto-zeroing phase.

5. The circuit of claim 3, wherein a differential input signal is provided to the first and second input signal nodes through a pair of input switches coupled to each node, and wherein the pair of input switches are arranged to be in a closed state during the operation phase and in an open state during the auto-zeroing phase.

6. The circuit of claim 1, wherein each the first, second, third, fourth, fifth, and sixth switches are implemented as single transistor circuits.

7. The circuit of claim 1, wherein each the first, second, third, fourth, fifth, and sixth switches are implemented as multiple transistor circuits.

8. The circuit of claim 1, wherein the second and fifth transistors are biased with substantially similar voltages.

9. The circuit of claim 6, wherein the first, second, third, fourth, fifth, and sixth transistors are one of: a PMOS FET, an NMOS FET, and a Bipolar Junction Transistor (BJT).

10. The circuit of claim 6, wherein the second and fifth transistors have substantially similar gate lengths.

11. The circuit of claim 6, wherein the third and sixth transistors have substantially similar gate lengths.

12. A method for providing balanced offset compensation to a differential amplifier circuit, comprising:
    receiving an analog differential input signal;
    when the circuit transitions from an auto-zeroing mode to an operation mode:
        opening a first switch coupled between a first amplifier input node and a first node, a third switch coupled between the first node and a first amplifier output node, a fourth switch coupled between a second amplifier input node and a second node, and a sixth switch coupled between the second node and a second amplifier output node;
        closing a second switch coupled between a first input signal node and the first node, and a fifth switch coupled between a second input signal node and the second node, wherein a first decoupling capacitor is coupled between the first input signal node and the first amplifier input node, and a second decoupling capacitor is coupled between the second input signal node and the second amplifier input node; and
    providing an amplified differential output signal in response to the differential input signal.

13. The method of claim 12, further comprising:
    when the circuit transitions from the auto-zeroing mode to the operation mode:
        disconnecting the first and second decoupling capacitors from a signal ground by opening a first discharge switch and a second discharge switch, respectively; then
        providing the differential input signal to the first and second input signal nodes by closing a first input switch and a second input switch.

14. The method of claim 12, further comprising:
    when the circuit transitions from the operation mode to the auto-zeroing mode:
        opening the first switch and the second switch; and
        closing the third, fourth, fifth, and sixth switches.

15. The method of claim 14, further comprising:
    disconnecting the received differential input signal from the decoupling capacitors by opening the first input switch and the second input switch coupled serially to the respective decoupling capacitors; and
    discharging the decoupling capacitors by closing the first discharge switch and the second discharge switch coupled between the respective decoupling capacitors and a signal ground node.

16. The method of claim 12, further comprising:
    operating the third, the fourth, the fifth, and the sixth switches simultaneously in response to an auto-zeroing signal; and
    operating the first and the second switches simultaneously in response to an inverted auto-zeroing signal.

* * * * *